(12) United States Patent
Chen et al.

(10) Patent No.: US 11,349,385 B2
(45) Date of Patent: May 31, 2022

(54) HIGH VOLTAGE START-UP CIRCUIT FOR SWITCHING POWER SUPPLIES

(71) Applicant: Queen's University at Kingston, Kingston (CA)

(72) Inventors: Yang Chen, Hefei (CN); Yan-Fei Liu, Kingston (CA)

(73) Assignee: Queen's University at Kingston, Kingston (CA)

( * ) Notice: Subject to any disclaimer, the term of this patent is extended or adjusted under 35 U.S.C. 154(b) by 6 days.

(21) Appl. No.: 16/999,403

(22) Filed: Aug. 21, 2020

(65) Prior Publication Data

US 2021/0057987 A1 Feb. 25, 2021

Related U.S. Application Data

(60) Provisional application No. 62/890,574, filed on Aug. 22, 2019.

(51) Int. Cl.
| | |
|---|---|
| *H02M 1/36* | (2007.01) |
| *H02M 3/335* | (2006.01) |
| *G01R 19/165* | (2006.01) |
| *G01R 15/04* | (2006.01) |
| *H02M 1/00* | (2006.01) |

(52) U.S. Cl.
CPC ............. *H02M 1/36* (2013.01); *G01R 15/04* (2013.01); *G01R 19/16538* (2013.01); *H02M 3/33576* (2013.01); *H02M 1/0006* (2021.05)

(58) Field of Classification Search
CPC .. H02M 1/36; H02M 3/33576; H02M 1/0006; G01R 19/16538; G01R 15/04
See application file for complete search history.

(56) References Cited

U.S. PATENT DOCUMENTS

| | | | |
|---|---|---|---|
| 7,723,971 B2* | 5/2010 | Hachiya ................. | H02M 3/156 323/282 |
| 9,742,262 B1* | 8/2017 | Jutras ..................... | H02M 3/335 |
| 2005/0052886 A1* | 3/2005 | Yang ........................ | H02M 1/44 363/49 |
| 2010/0309689 A1* | 12/2010 | Coulson ............ | H02M 3/33507 363/16 |
| 2012/0294048 A1* | 11/2012 | Brinlee .................... | H02M 1/36 363/21.18 |

* cited by examiner

*Primary Examiner* — Harry R Behm
(74) *Attorney, Agent, or Firm* — Stephen J. Scribner

(57) ABSTRACT

A start-up circuit for a power converter includes a charging circuit that uses a DC bus voltage of the power converter to generate a charging current to charge an energy storage device to a selected voltage and an auxiliary power output circuit including a transformer primary side auxiliary winding. A control circuit controls one or more switches of the start-up circuit and one or more switches of the power converter primary side. The charging current provides power to the control circuit until the auxiliary power is established. The control circuit disables the start-up circuit when the auxiliary power output is established. The start-up circuit has very low standby power consumption and compact size, and is particularly suitable for power converter applications such as power adapters for portable electronic devices.

20 Claims, 6 Drawing Sheets

HIGH VOLTAGE START-UP CIRCUIT FOR SWITCHING POWER SUPPLIES

RELATED APPLICATION

This application claims the benefit of the filing date of Application No. 62/890,574, filed on 22 Aug. 2020, the contents of which are incorporated herein by reference in their entirety.

FIELD

This invention relates to start-up circuits for power supplies. More particularly, the invention relates to high voltage start-up circuits for switching mode power supplies.

BACKGROUND

In switching power supplies a start-up apparatus (i.e., a start-up circuit) is used to establish power for the for the primary side control circuit at initial power up. It is preferred to automatically disconnect the start-up power circuit during normal operation when a separate power source is used to provide the energy/power to the control circuit in order to achieve less power consumption. Auto disconnection is a key function in applications where ultra-low standby power is required. FIG. 1 shows a typical implementation of a start-up circuit 10 and auxiliary power source from a transformer winding Na, according to the prior art. In this case, the auxiliary winding Na generates an auxiliary voltage across capacitor Caux during normal operation. During the start-up period, the start-up circuit provides voltage across Caux which is used, via a regulator 12, to power the control circuit 14. The control circuit provides gating signals to the primary side components 16.

Such an arrangement may employ normally-on devices in the start-up circuit, e.g., a depletion-mode junction field-effect transistor (JFET). Such devices can conduct current with no control voltage applied to the gate. Thus, they are good candidates for start-up before the control circuit is powered up. However, available JFETs have a low voltage rating (below 50V) and low power rating (below 1 W). Accordingly, they are mostly used for low voltage ICs, but not for offline AC-DC power supplies, such as power adapters for laptop computers and cellphones.

Some analog control ICs feature low power consumption, and the supply current is in the sub-milliampere (mA) range. Such control circuits may be powered directly from a high voltage bus with a startup circuit and low stand-by power consumption. However, other analog control ICs and most digital controllers usually require several milliamperes to hundreds of milliamperes of supply current. These may require several watts to tens of watts with high voltage at hundreds of volts, which is difficult to accommodate and results in significant stand-by power consumption.

SUMMARY

One aspect of the invention relates to a start-up circuit for a power converter, comprising: an input that receives a power converter primary side DC bus voltage; a charging circuit that uses the DC bus voltage to generate a charging current to charge an energy storage device to a selected voltage; an auxiliary power output circuit including a transformer primary side auxiliary winding; a sensing circuit that senses the primary side DC bus voltage; and a control circuit that controls one or more switches of the start-up circuit and one or more switches of the power converter primary side, and disables the start-up circuit when the auxiliary power output is established; wherein the charging current provides power to the control circuit until the auxiliary power is established.

In one embodiment the control circuit comprises a timer; wherein the timer generates a signal that disables the start-up circuit after a selected time period; wherein the auxiliary power output is established by the end of the selected time period.

In one embodiment the selected time period is about 10 ms to about 1 s.

In one embodiment the selected time period is about 25 ms to about 50 ms.

In one embodiment the control circuit comprises an auxiliary voltage sensor and the control circuit generates a signal that disables the start-up circuit when the sensed auxiliary voltage is at a selected voltage.

In one embodiment the auxiliary voltage sensor comprises a resistor divider network and an analogue-to-digital converter (ADC).

In one embodiment the control circuit comprises a microcontroller unit (MCU).

In one embodiment the start-up circuit comprises a latch circuit that transfers power from the energy storage device to the control circuit when the energy storage device reaches the selected voltage; wherein the energy storage device provides power to the control circuit until the auxiliary power is established.

In one embodiment the energy storage device is a capacitor.

In one embodiment the sensing circuit comprises a resistor-divider network.

In one embodiment the resistor-divider network also provides biasing for a power switch of the charging circuit.

A start-up circuit according to the embodiments may be implemented in an AC-DC power converter. The AC-DC power converter may be a power adapter for a portable electronic device.

Another aspect of the invention relates to an AC-DC power converter comprising a start-up circuit as described herein.

Another aspect of the invention relates to a method for implementing a start-up circuit for a power converter, comprising: using a DC bus voltage of the power converter to generate a charging current to charge an energy storage device to a selected voltage; providing an auxiliary power output circuit including a transformer primary side auxiliary winding; using a control circuit to control one or more switches of the start-up circuit and one or more switches of the power converter primary side, and to disable the start-up circuit when the auxiliary power output is established; wherein the charging current provides power to the control circuit until the auxiliary power is established.

In one embodiment of the method, the control circuit comprises a timer; wherein the timer generates a signal that disables the start-up circuit after a selected time period; wherein the auxiliary power output is established by the end of the selected time period. The method may include setting a time period of about 10 ms to about 1 s, or about 25 ms to about 50 ms.

In one embodiment of the method, the control circuit comprises an auxiliary voltage sensor and the control circuit generates a signal that disables the start-up circuit when the sensed auxiliary voltage is at a selected voltage.

In one embodiment the method comprises using a latch circuit to transfer power from the energy storage device to the control circuit when the energy storage device reaches the selected voltage; wherein the energy storage device provides power to the control circuit until the auxiliary power is established.

In one embodiment the method comprises implementing the start-up circuit in an AC-DC power converter, wherein the AC-DC power converter may be a power adapter for a portable electronic device.

BRIEF DESCRIPTION OF THE DRAWINGS

For a greater understanding of the invention, and to show more clearly how it may be carried into effect, embodiments will be described, by way of example, with reference to the accompanying drawings, wherein.

DETAILED DESCRIPTION OF EMBODIMENTS

Figure 1:
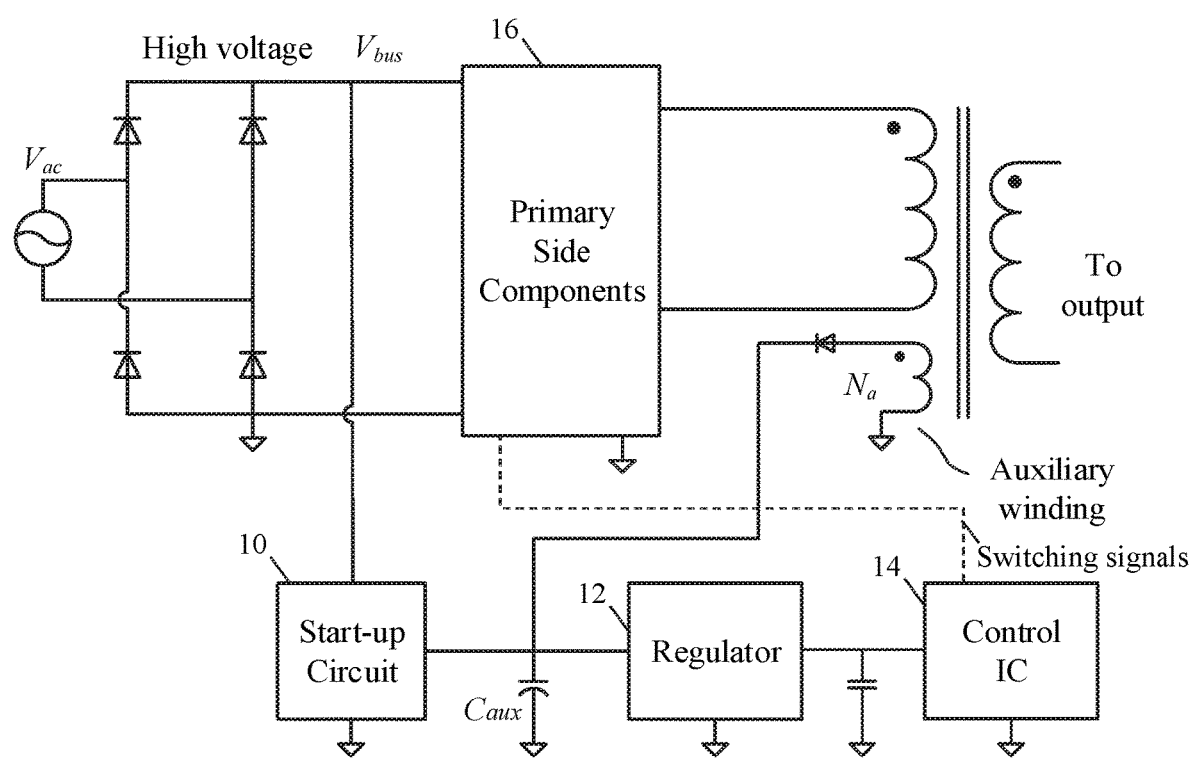
FIG. 1 is a circuit diagram of a start-up and auxiliary power circuit according to the prior art.

Described herein is a start-up apparatus (i.e., start-up circuit) for high voltage power converters, used to establish auxiliary power for the power converter primary side control circuit at initial power up. In some cases, a start-up circuit embodiment of the invention may substantially replace a start-up circuit of a prior designs. For example, in the prior AC-DC converter shown in FIG. 1, the start-up circuit 10 may be replaced with a start-up circuit according to an embodiment described herein. The AC-DC power converter, also referred to herein as a power supply or power adapter, may be, for example, a switching power converter. Power adapters may be of the type used to supply power and charge batteries of portable electronic devices such as laptop computers, tablets, and cellular phones. Some embodiments are suitable for power converters with an AC input from the utility grid, with AC input voltages of, e.g., 110-240 VAC. Such power converters may have a primary side DC voltage bus of, e.g., 200-400 V, and may be referred to herein as "high voltage". The start-up circuit only operates at the initial power up period and does not operate once auxiliary power is established. This enables ultra low standby power consumption to meet industry standards.

According to embodiments described herein, the start-up circuit uses an energy storage device such as a storage capacitor as a reservoir. The storage capacitor is charged with a small current from the high voltage bus and does not release power to the controller until the reserved energy/voltage is high enough. The small charging current allows use of low power rating components, resulting in reduced cost and footprint.

In one embodiment, the start-up circuit requires only one high-voltage transistor and several low-voltage low-power transistors, and does not require JFETs. Most of the components in the circuit can be easily integrated into an IC, and implementation with discrete components is feasible as well.

In some embodiments, at least one high voltage switch (e.g., Q1 in FIG. 2A), one or more high voltage (and therefore, high value) resistors (e.g., R1 and R2 in FIG. 2A), and one energy storage capacitor (e.g., C1 in FIG. 2A) are needed. In some embodiments, the maximum voltage across the energy storage capacitor is controlled by a Zener diode (e.g., Z1 in FIG. 2A). In order to reduce the power consumption, a start-up control circuit is used to turn off the high voltage switch during the normal operating condition of the AC-DC converter, when the auxiliary power is established. In some embodiments, the start-up control circuit may be implemented with a microcontroller unit (MCU).

Figure 2A:
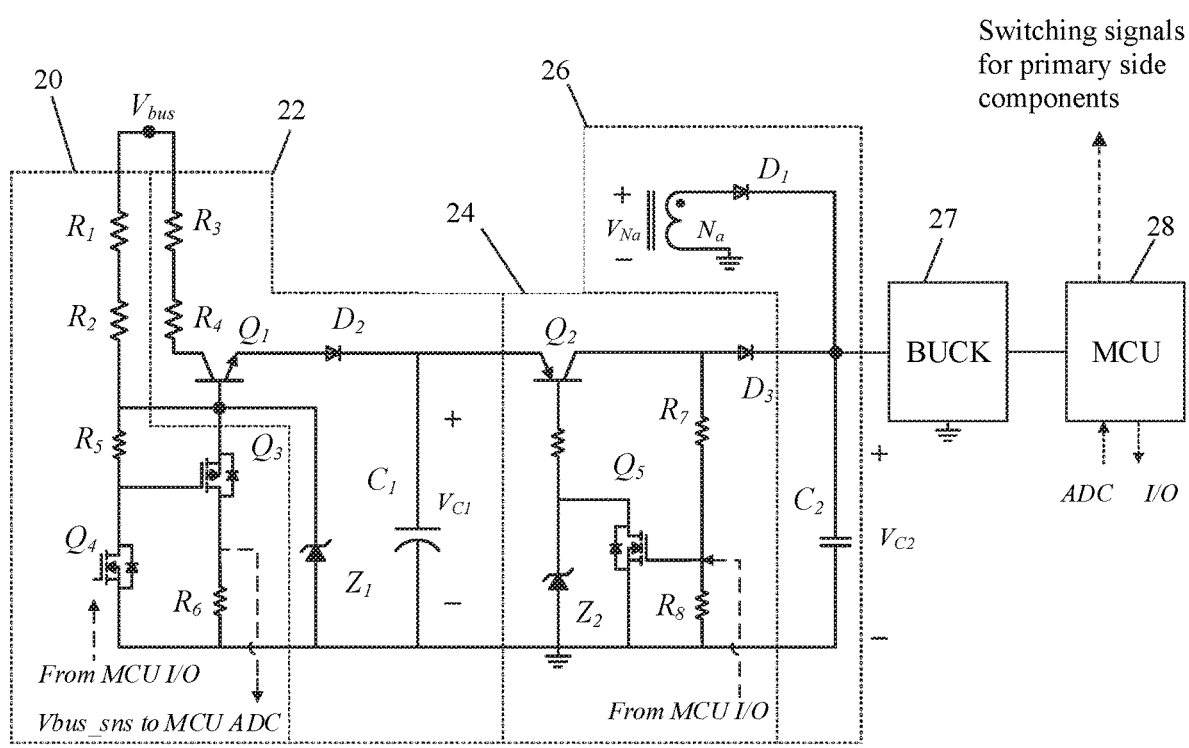
FIGS. 2A-2D are circuit diagrams of start-up and auxiliary power circuits according to various embodiments.

In one embodiment, a latch circuit is used to extend the operation range of the energy storage capacitor in the start-up circuit (e.g., C1 in FIG. 2A). The capacitor can be discharged to a low voltage (e.g., 5V) from its initial voltage (e.g., 25V) so that almost all the energy stored in the capacitor can be utilized. This means that a smaller value capacitor is needed for a fixed time period required for the start-up of the power supply. In one embodiment, such as that shown in FIG. 2A, a Zener diode (Z2), a PNP bipolar junction transistor (BJT) (Q2) and an N-channel MOSFET (Q5) are used to implement the latch circuit. By changing the voltage potential of the base terminal of Q2, the on and off duration of Q2 can be controlled and therefore the capacitor C1 discharging time can be extended. Before Q2 is turned on, its voltage potential at the base terminal is high as determined by the Zener diode Z2. When Q2 is turned on, the Zener diode Z2 is short circuited by turning on of Q5. Q5 is turned on by the voltage across C1 (Vc1) through the resistor divider (R7, R8). Therefore, the voltage potential of the base terminal of Q2 is low and Q2 will remain on even when the voltage across C1 becomes lower. During normal operation, Q5 is turned on by the control circuit (an MCU is used as an example).

In some embodiments a resistor divider network is used to set the biasing of the main power switch in the start-up circuit. The same resistors may be used to sense the converter input voltage (i.e., the DC bus voltage) during normal operation of the power supply. In addition, in one embodiment two low voltage switches (e.g., Q3 and Q4 in FIG. 2A) are used to turn off the high voltage switch (Q1) and to sense the input voltage. Therefore, the same high voltage resistor (s) of the start-up circuit may be utilized during both start-up and normal operation.

Thus, as described herein, a resistor divider network provides both biasing for the high voltage switch of the start-up circuit and a point of monitoring the converter input voltage during steady state operation. Since input voltage monitoring is required by most applications, multi-use of the resistors helps to reduce the standby power loss and cost.

Operation will now be described in detail with reference to the embodiment of FIG. 2A. Referring to FIG. 2A, dashed lines separate different portions of the circuit, wherein 20, 22, and 24 are the start-up circuit and 26 is an example of an auxiliary power supply from an auxiliary transformer winding Na. In cases where the output voltage of the auxiliary power supply 26 is too high for the subsequent control circuit, a Buck converter 27 may be used to provide suitable power to the control circuit 28, e.g., a microcontroller unit (MCU). As can be seen in FIG. 2A, the MCU 28 is used to control operation of the start-up circuit, and to provide driving signals to one or more switches of the converter primary side components during normal operation.

The circuit in 20 is a resistor divider network for monitoring the input voltage Vbus and for biasing Q1. R1 and R2 are of large ohmic values (e.g. 1 MegaOhm (Me)) and 200V or higher voltage rating for 120V and/or 220V AC application. Since Vbus may be a high voltage, R1 and R2 are implemented as series resistors (instead of a single resistor) to improve circuit reliability. Q3 is a P channel MOSFET biased by R5 to be at off state (not conducting current) initially. Q4 is an N channel MOSFET controlled by, e.g., the MCU 28 I/O ports or other control signals from a controller. After start-up is finished, Q4 is turned on by the control signal, which further turns on Q3 by pulling its gate to ground. It is noted that the start-up operation is considered finished when the auxiliary winding voltage $V_{Na}$ is established and provides current to the control circuit (e.g., the Buck converter 27 and the MCU 28, in the embodiment of FIG. 2A). Then R5 and R6 are connected in parallel and the voltage across the parallel connection of R5 and R6 is proportional to the input voltage (or bus voltage as shown in FIG. 2A). The relation of the sensed voltage Vbus_sns and the actual bus voltage is shown in (1).

$$Vbus\_sns = \frac{R5//R6}{R5//R6 + R1 + R2} * Vbus \qquad (1)$$

The circuit in 22 includes the storage capacitor (reservoir) C1 and its charging circuit. As noted above, R1 and R2 in 20 also serve as the biasing resistors for Q1 in 22. Q1 may be implemented with an NPN BJT. After Vbus is established, the charging current of C1 (Ic1) can be calculated approximately by (2), if the voltage drop on Q1 and D2 is neglected.

$$Ic1 = \frac{Vbus - Vc1}{R3 + R4} \qquad (2)$$

Typically, R3 and R4 can dissipate up to 1 W at start-up, which means the charging current Ic1 is about 2.5 mA for a 400V bus. As noted above in respect of R1 and R2, R3 and R4 are also implemented as series resistors to improve circuit reliability.

Figure 2B:
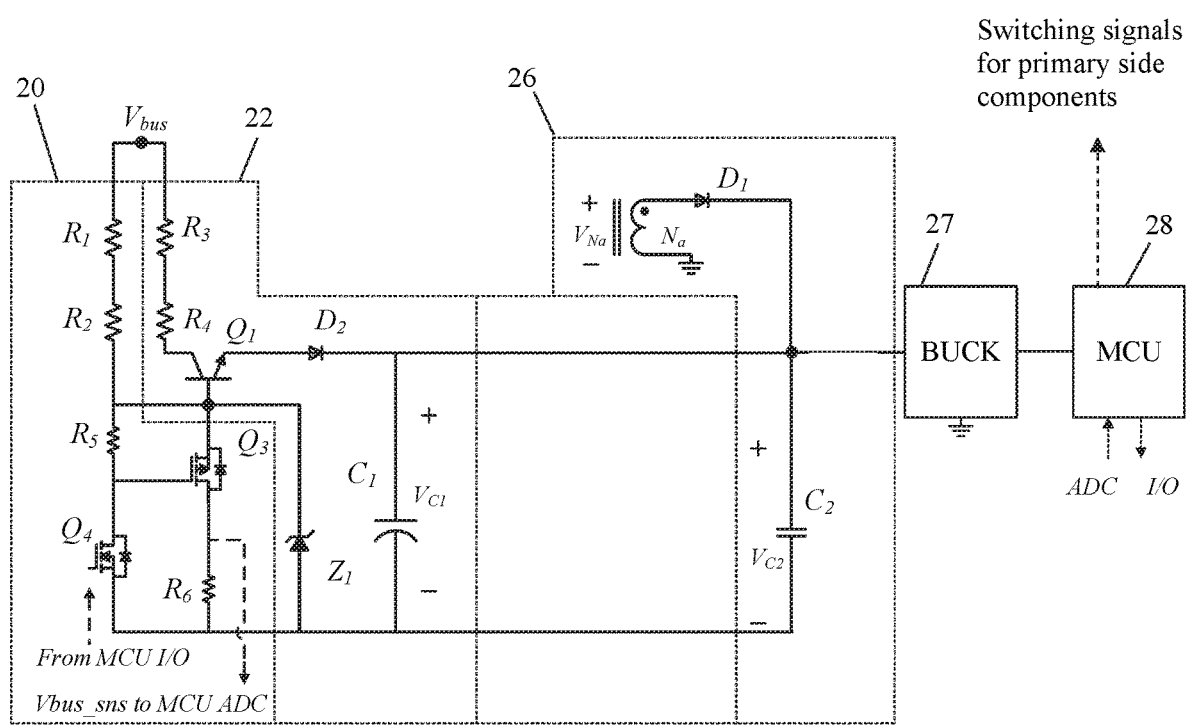

In the case that the controller (e.g., MCU 28) needs lower supply current than Ic1, the circuit shown at 24 can be omitted and the controller can be powered by the bus directly. Such an embodiment is shown in FIG. 2B. C1 will be charged to and remain at the breakdown voltage of the Zener diode Z1.

However, if the controller requires a higher supply current than Ic1, then the controller supply voltage cannot be sustained due to overloading. Vc1 and Vc2 will remain very low (e.g., 2-3 volts). It is noted that in many cases, the charging current Ic1 is lower than the supply current required by the controller.

To accommodate a high supply current of the controller, the circuit in 24 (FIG. 2A) is used for holding and releasing the power stored in C1. Q2 (e.g., a PNP BJT or a P-channel MOSFET) is at off state initially, so C1 will not be discharged through Q2 and C1 is charged by the Vbus with a small current as shown in equation (1). After C1 voltage reaches the breakdown voltage of Z2, Q2 is turned on. The voltage at the collector of Q2 becomes high and the voltage at the gate of Q5 is high also through resistors R7 and R8. Therefore, Q5 is turned on automatically when Q2 is turned on. After Q5 is turned on, the base voltage of Q2 becomes low and Z2 is shorted to ground. Then, Q2 will continuously conduct current as long as Vc1 is positive.

For a typical design, the breakdown voltage of Z1 (Vz1) is about 25V and the breakdown voltage of Z2 (Vz2) is about 22V. Only limited energy stored in C1 can be released. That is, Q2 will conduct for a much shorter period of time. It is noted that the energy stored in a capacitor is proportional to the capacitor value and the square of the capacitor voltage.

With the circuit in 24, Q2 will remain on when Vc1 is from about 25V to about 5V. Therefore, most of the energy stored in C1 will be released and Q2 will conduct for a much longer time. While Q2 is on, C1 will provide the power to C2 and the next stage circuit with adequate supplying current. Therefore, the circuit in 24 (Q2, Q5, and Z2, and related components) serves as a latch circuit to keep Q2 on so that C1 can be discharged to a low voltage.

After the power from the auxiliary winding Na is established, the MCU 28 will produce a signal to turn on Q4 through the I/O port, then the circuit in 20 will monitor the input voltage. The sensing point voltage is below about 3.3V, and it is lower than the voltage on C1. Thus, Q1 is automatically turned off after Q4 is turned on.

As described above, the start-up operation is considered finished when the auxiliary winding voltage $V_{Na}$ is established and provides current to the control circuit (e.g., the MCU 28, and optionally the Buck converter 27 in the embodiments of FIGS. 2A and 2B). Two ways of controlling switching of the power source from the start-up circuit (20, 22, and optionally 24 in FIG. 2A) to the auxiliary power circuit (26 in FIG. 2A) are described below.

Once the MCU is powered up from the start-up circuit (i.e., C1), the MCU starts a timer of, e.g., 10 ms to 1 s, typically about 25 ms to 50 ms. After this delay, the MCU will turn off the start-up circuit by sending a control signal to turn on Q4 (and, when the latch circuit 24 is used, also sending a control signal to turn on Q5). Then the auxiliary power circuit 26 will provide power for MCU. The design of the C1 value, Z1 breakdown voltage, and the delay time ensures auxiliary power is established by the time the start-up circuit is turned off.

Figure 2C:
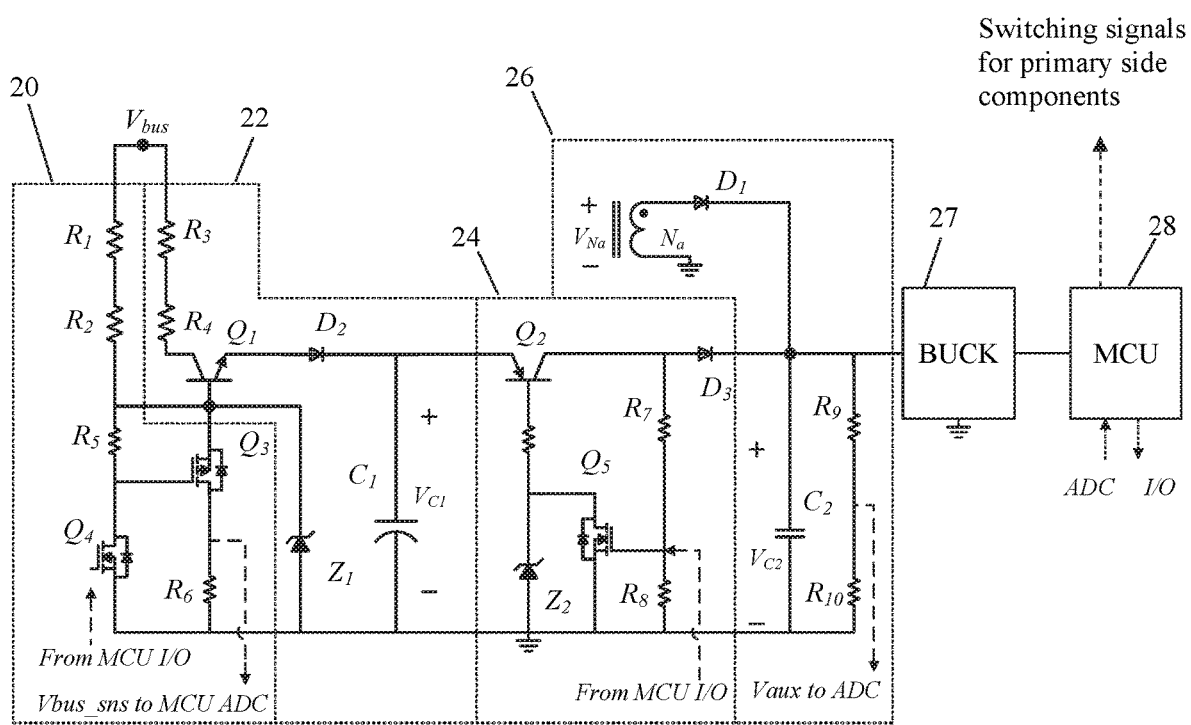
Figure 2D:
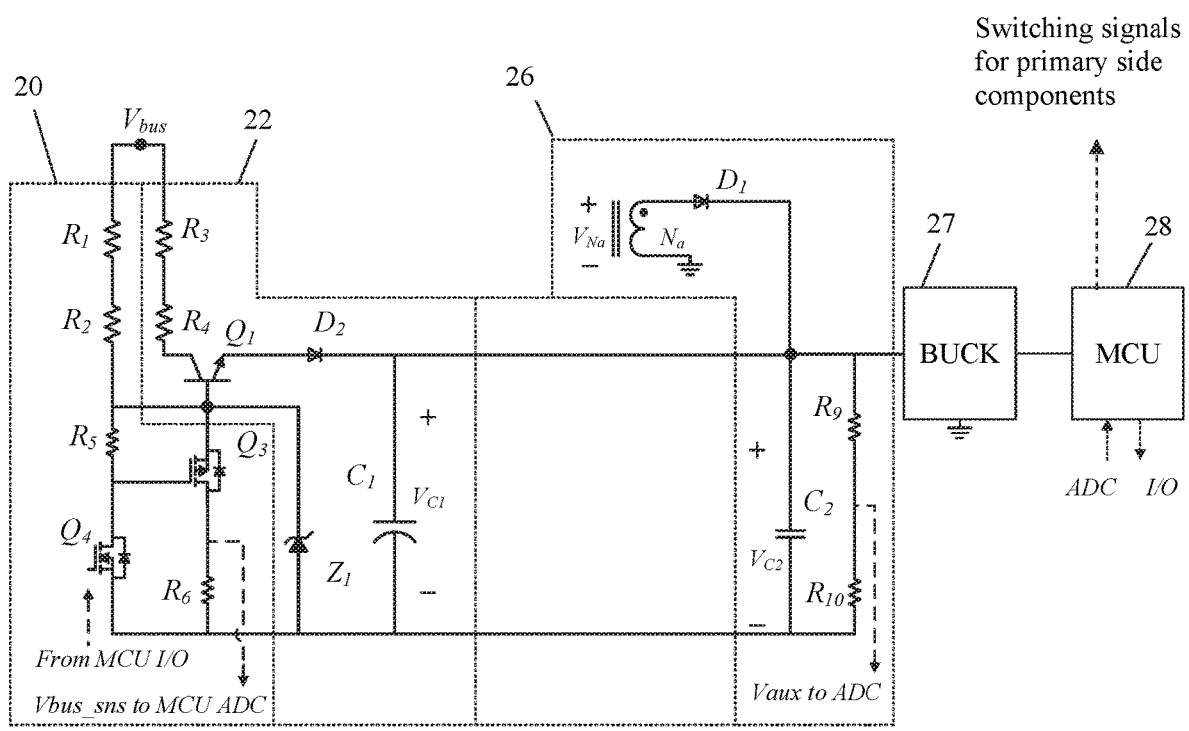

Alternatively, once the MCU is powered up from the startup circuit (i.e., C1), the MCU senses the auxiliary voltage Vaux through sensing resistors, e.g., R9 and R10 as shown in the embodiments of FIGS. 2C and 2D. When Vaux reaches a selected level, the MCU will shut down the start-up circuit by sending a control signal to turn on Q4 (and, when the latch circuit 24 is used, also sending a control signal to turn on Q5). Then the auxiliary power circuit 26 will provide power for MCU.

It is noted that the auxiliary winding Na is one way to provide power to the control circuit during normal operation. Another way to provide power to the control circuit is to use a DC to DC converter from the secondary side (i.e., the output side) of the AC-DC converter.

It should be noted that in the embodiments shown in FIGS. 2A, 2B, 2C, and 2D, all MOSFETs can be replaced by BJTs and vice versa.

Figure 3:
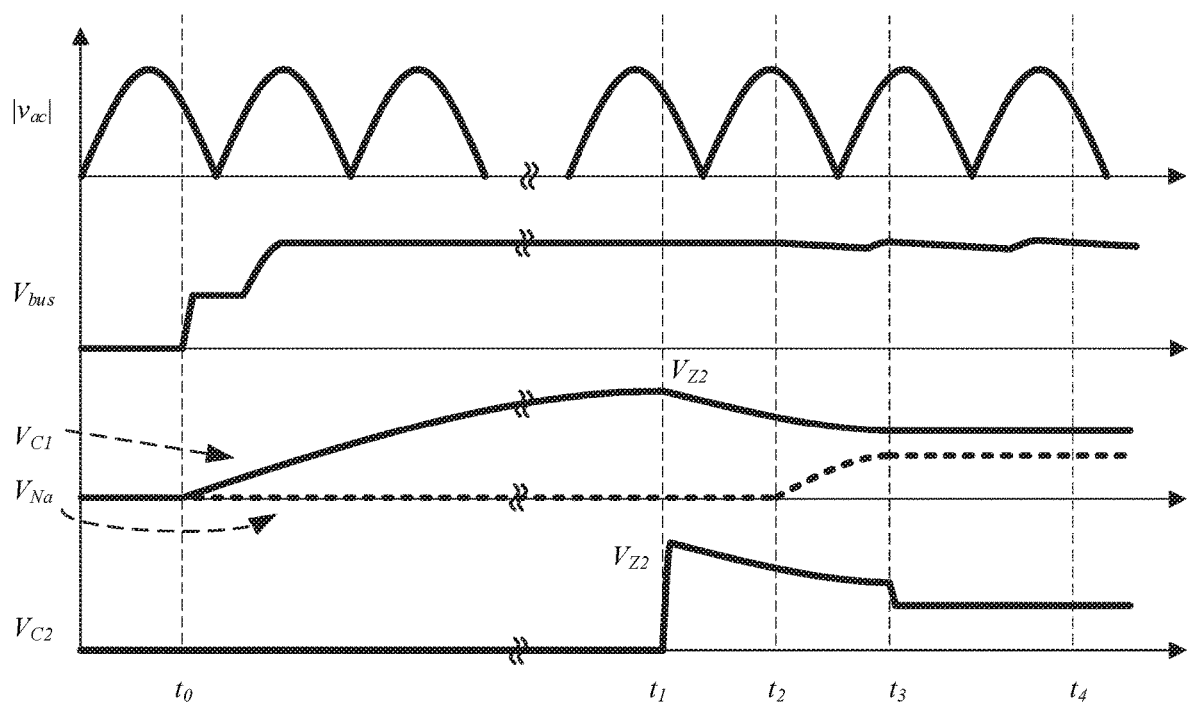
FIG. 3 is a diagram showing voltage waveforms of the embodiment of FIG. 2A during start-up.

FIG. 3 shows the voltage waveforms during start-up. Vac is the AC voltage from the utility grid. Vbus is the voltage after rectifiers. At t0, the converter is connected to the AC outlet, and Vbus increases to the peak of the AC voltage. In the meantime, C1 is slowly charged by Vbus. At t1, Vc1 reaches the breakdown voltage of Z2 at Vz2. Then T2 is turned on and C1 releases power to C2. The MCU starts to operate at t1. After t1, the energy stored in C1 will be released through Q2 to provide power (energy) for operation of the control circuit, such as the Buck converter 27 and MCU 28, as shown in FIG. 2A. At t2, the main power converter starts to operate and the auxiliary voltage from the winding starts to build up. Once the auxiliary voltage is established at t3, Q5 is turned off by a control signal from the MCU 28. Then Q1 will be off and Q2 will also be off. No current will flow through Q1. The control circuit (e.g., Buck converter 27 and MCU 28) will be powered only by the auxiliary winding Na. Q4 can be turned on at any time after t1. When Q4 is turned on, Q3 will also be turned on and the base voltage of Q1 will be low (below 3.3V, for example).

EQUIVALENTS

While the invention has been described with respect to illustrative embodiments thereof, it will be understood that various changes may be made to the embodiments without departing from the scope of the invention. Accordingly, the described embodiments are to be considered merely exemplary and the invention is not to be limited thereby.

The invention claimed is:

1. A start-up circuit for a power converter, comprising:
   an input that receives a power converter primary side DC bus voltage;
   a charging circuit including a first switch that uses the DC bus voltage to generate a charging current to charge an energy storage device to a selected voltage;
   an auxiliary power output circuit including a transformer primary side auxiliary winding;
   a sensing circuit that senses the primary side DC bus voltage; and
   a control circuit that controls one or more switches of the start-up circuit and one or more switches of the power converter primary side, and turns off the first switch of the charging circuit and discharges the energy storage device when the auxiliary power output is established;
   wherein the charging current provides power to the control circuit until the auxiliary power is established.

2. The start-up circuit of claim 1, wherein the control circuit comprises a timer;
   wherein the timer generates a signal that turns off the first switch of the charging circuit after a selected time period;
   wherein the auxiliary power output is established by the end of the selected time period.

3. The start-up circuit of claim 2, wherein the selected time period is about 10 ms to about 1 s.

4. The start-up circuit of claim 2, wherein the selected time period is about 25 ms to about 50 ms.

5. The start-up circuit of claim 1, wherein the control circuit comprises an auxiliary voltage sensor and the control circuit generates a signal that turns off the first switch of the charging circuit when the sensed auxiliary voltage is at the selected voltage.

6. The start-up circuit of claim 5, wherein the auxiliary voltage sensor comprises a resistor divider network and an analogue-to-digital converter (ADC).

7. The start-up circuit of claim 1, wherein the control circuit comprises a microcontroller unit (MCU).

8. The start-up circuit of claim 1, comprising a latch circuit that transfers power from the energy storage device to the control circuit when the energy storage device reaches the selected voltage;
   wherein the energy storage device provides power to the control circuit until the auxiliary power is established.

9. The start-up circuit of claim 1, wherein the energy storage device is a capacitor.

10. The start-up circuit of claim 1, wherein the sensing circuit comprises a resistor-divider network.

11. The start-up circuit of claim 10, wherein the resistor-divider network also provides biasing for a power switch of the charging circuit.

12. The start-up circuit of claim 1, wherein the start-up circuit is implemented in an AC-DC power converter.

13. The start-up circuit of claim 12, wherein the AC-DC power converter is a power adapter for a portable electronic device.

14. An AC-DC power converter comprising the start-up circuit of claim 1.

15. A method for implementing a start-up circuit for a power converter, comprising:
    using a DC bus voltage of the power converter and a charging circuit to generate a charging current to charge an energy storage device to a selected voltage;
    providing an auxiliary power output circuit including a transformer primary side auxiliary winding;
    using a control circuit to control one or more switches of the start-up circuit and one or more switches of the power converter primary side, and to turn off a first switch of the charging circuit and discharge the energy storage device when the auxiliary power output is established;
    wherein the charging current provides power to the control circuit until the auxiliary power is established.

16. The method of claim 15, wherein the control circuit comprises a timer;
    wherein the timer generates a signal that turns off the first switch of the charging circuit after a selected time period;
    wherein the auxiliary power output is established by the end of the selected time period.

17. The method of claim 15, wherein the control circuit comprises an auxiliary voltage sensor and the control circuit generates a signal that turns off the first switch of the charging circuit when the sensed auxiliary voltage is at the selected voltage.

18. The method of claim 15, comprising using a latch circuit to transfer power from the energy storage device to the control circuit when the energy storage device reaches the selected voltage;
    wherein the energy storage device provides power to the control circuit until the auxiliary power is established.

19. The method of claim 15, comprising implementing the start-up circuit in an AC-DC power converter.

20. The method of claim 19, wherein the AC-DC power converter is a power adapter for a portable electronic device.

* * * * *